United States Patent [19]
Seiler

[11] 4,186,418
[45] Jan. 29, 1980

[54] OVERVOLTAGE PROTECTED INTEGRATED CIRCUIT NETWORK, TO CONTROL CURRENT FLOW THROUGH RESISTIVE OR INDUCTIVE LOADS

[75] Inventor: Hartmut Seiler, Reutlingen, Fed. Rep. of Germany

[73] Assignee: Robert Bosch GmbH, Stuttgart, Fed. Rep. of Germany

[21] Appl. No.: 823,287

[22] Filed: Aug. 10, 1977

[30] Foreign Application Priority Data

Aug. 25, 1976 [DE] Fed. Rep. of Germany ....... 2638178

[51] Int. Cl.$^2$ ............................................ H02H 3/20
[52] U.S. Cl. ..................................... 361/91; 361/56; 361/111; 330/207 P
[58] Field of Search ...................... 361/56, 91, 18, 159, 361/100, 101, 111, 88, 90; 330/207 P; 323/22 T, 9, 22 Z, DIG. 1; 307/318, 327, 237, 100, 130, 134, 135

[56] References Cited
U.S. PATENT DOCUMENTS

| | | | |
|---|---|---|---|
| 3,662,228 | 5/1972 | Boeters et al. | 361/159 |
| 3,668,545 | 6/1972 | Recklinghausen | 361/91 X |
| 3,860,855 | 1/1975 | Caswell | 361/18 X |

FOREIGN PATENT DOCUMENTS 2223376  11/1973  Fed. Rep. of Germany ........... 361/101

OTHER PUBLICATIONS

I.B.M. Technical Disclosure Bulletin–"Short-Circuit Protection and Starting Device for Series Regulator," vol. 7, No. 12, pp. 1234–1235, May 1965 by W. C. Leung.

Primary Examiner—Patrick R. Salce
Attorney, Agent, or Firm—Frishauf, Holtz, Goodman & Woodward

[57] ABSTRACT

The main switching transistor 11 is serially connected between a load 12, 12' and a source of supply 13, R. An auxiliary transistor 15, the base of which is controlled through a voltage sensing device, for example a Zener diode 18 has its main switching path connected to the base of the main switching transistor 11 to control the main switching transistor 11 to become conductive in case of overvoltage, sensed by breakdown of the Zener diode 18. If the load is inductive, an additional inductive turn-off current bypass transistor 22, 22' can be provided (FIG. 2, 3), rendered conductive when overvoltage of an inductive kick is sensed, to bypass turn-off current around the main semiconductor switching transistor, or, in an alternative connection, to control the main switching transistor to again become conductive and itself bypass the inductive turn-off current, so that current flow due to overvoltages, or inductive turn-off current will be conducted by semiconductors operated under conditions of controlled conduction.

14 Claims, 3 Drawing Figures

OVERVOLTAGE PROTECTED INTEGRATED CIRCUIT NETWORK, TO CONTROL CURRENT FLOW THROUGH RESISTIVE OR INDUCTIVE LOADS

Cross reference to related applications assigned to the assignee of the present application:
Ser. No. 823,286, filed Aug. 10, 1977, Seiler et. al.
Ser. No. 823,285, filed Aug. 10, 1977, Seiler et. al.

The present invention relates to a protective circuit arrangement or network for integrated circuits to protect the integrated circuits against overvoltages in which the integrated circuit is used as a control element or control switch to control current flow through a load.

BACKGROUND AND PRIOR ART

It has previously been proposed to control current flow through a load, particularly incandescent lamps, relay coils, motors, or the like by controlling conduction of a power transistor, or another power semiconductor element. If the load is essentially a low impedance load, having one terminal connected to a supply source which is subject to voltage surges, protecting the integrated circuit by an integrated Zener diode is difficult.

Zener diodes as voltage protecting devices are well known; these diodes break down when the predetermined voltage is applied thereto, thus limiting overvoltage peaks. Such circuits cannot always be used in integrated circuit (IC) networks, or may be suitable therefore. If excess voltages occur during a period of time which is more than a sudden brief excess pulse, then integrated Zener diodes cannot be used since the thermal capacity of the housing for the IC chip must then be dimensioned to be capable of dissipating the power in the Zener diode upon breakdown. This power is substantially higher than the normal operating power, and hence the IC chip will heat excessively. Excessive heating of the chip will also damage, or destroy the power transistor, so that it will, thermally, break down.

SUBJECT MATTER OF THE PRESENT INVENTION

It is an object to provide a network and circuit to protect IC chips having a control transistor to control current flow through a load against overvoltages which can occur during operation, and in which the voltage limiting circuit can be integrated with the IC chip.

Briefly, an auxiliary controlled semiconductor switch is provided having its switching path connected to the control terminal of the main control semiconductor switch. The auxiliary controlled semiconductor switch is connected to a voltage sensing network which senses overvoltages so that in case of an overvoltage, the auxiliary controlled semiconductor switch is rendered conductive controlling the main semiconductor switch to become conductive so that excessive voltages are bypassed through the main semiconductor switch, which is dimensioned and designed to be capable of carrying higher currents and dissipating a greater power level than a voltage sensing device, such as a Zener diode.

The network has the advantage that by rendering the power transistor conductive, the semiconductor element is thermally essentially stable. A conductive transistor, for example, is thermally more stable than a transistor or semiconductor which is operated in blocked condition. Additionally, a conductive transistor or similar semiconductor has a much lower heat loss than a Zener diode, considering the current flow through both devices to be equal. A conductive transistor has a heat power loss which is almost an order of magnitude less than that of a Zener diode, substantially decreasing the thermal loading of the IC chip.

If the load is an inductive load, for example a relay coil or the like, a free wheeling or anti-inductive kick circuit can be used which, in accordance with a feature of the invention, can be a transistor to conduct the inductive kick current. Inductive loads not only generate overvoltages but also turn-off currents. The free wheeling transistor can be so connected that the turn-off current is bypassed around the main switching control transistor. The free wheeling or bypassed transistor is controlled either directly from a terminal of the network or it can be controlled from the auxiliary transistor which additionally compensates for overvoltages being applied to the network.

Drawings illustrating an example:

Figure 1:
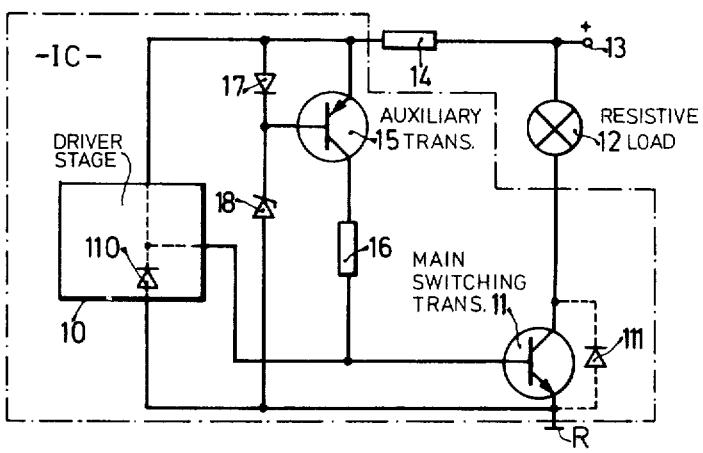
FIG. 1 is a schematic block diagram illustrating an overvoltage protective circuit for a resistive load.

An integrated circuit IC (FIG. 1) comprises a driver stage 10 and power stage formed by a main switching transistor 11. The driver stage 10 can be of any desired type and need not be described in detail. Power transistor 11 is a npn transistor, the base of which is controlled by driver stage 10. The emitter of the power transistor 11 is connected to ground, chassis, or a reference terminal. Its collector is connected to one terminal of a load 12, shown as a resistive load, for example an incandescent light bulb. The other terminal of the load 12 is connected to the protective terminal 13 of the supply source. Positive terminal 13 is connected over a current limiting resistor 14 to the IC including the driver stage 10 and the power transistor 11. The current limiting resistor 14 usually is not integrated with the IC and need not necessarily be used. As well known, the various circuit components form diodes with respect to the substrate of the chip. These diodes are shown schematically in broken lines as diodes 110, 111, bridging the driver stage 10, and the power transistor 11, respectively.

An auxiliary npn transistor 15 has its emitter is connected to the current limiting resistor 14 thence to terminal 3, and its collector through a collector resistor 16 to the base of the power transistor 11. The base-emitter path of transistor 15 is protected by a protective diode 17 bridging the base-emitter junction. A voltage limiting device 18, in simplest form a Zener diode is connected between the base of the transistor 15 and reference potential. One or more Zener diodes may be used, and other devices may also be used. The elements 15 to 18 can be integrated on the IC, as shown schematically by being enclosed in the chain dotted box.

Operation

If overvoltage occurs at terminal 13, and the voltage rises above the threshold level of the voltage sensing device 18, voltage sensor 18 will limit the voltage at the junction point of the external resistor with the IC to the limiting voltage thereof. Since current through the voltage limiting circuit can flow entirely or partially through a base-emitter path of transistor 15, the transistor 15 will become conductive when the voltage limiting device responds, that is, when current will flow through the voltage limiting device 18. This causes transistor 15 to become conductive, controlling transistor 11 to likewise become conductive due to the connection of resistor 16 with the base of transistor 11. If the excess voltage agains drops below the limiting value of the voltage sensing device 18, transistor 15 will block which again causes blocking of transistor 11, unless it is commanded to be conductive by driver stage 10.

Figure 2:
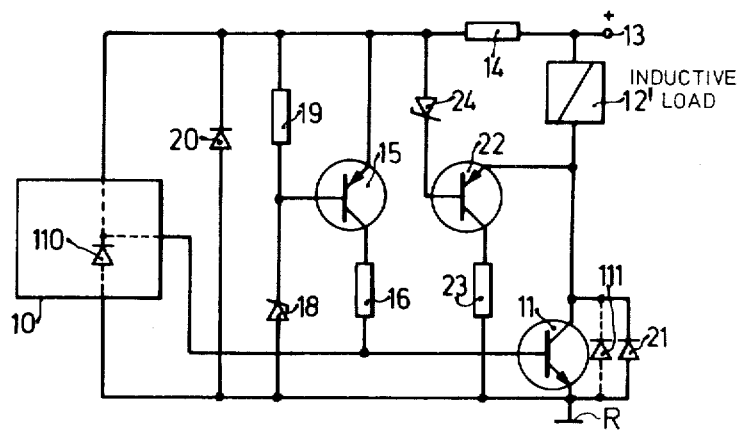
FIG. 2 illustrates another embodiment in which an additional circuit is provided to bypass the turn-off current of an inductive load.

Embodiment of FIG. 2: similar parts of functioning similarly, have been given the same reference numerals and will not be described again. The protective diode 17 has been replaced, however, by a coupling resistor 19. Two reverse polarity protective diodes 20, 21 are connected in the network, one parallel to the driver stage 10 and the other parallel to the switching path of the power transistor 11. They protect the IC against reverse polarity.

The embodiment of FIG. 2 can advantageously be used with loads which are not only resistive, but additionally are inductive. For example, and as shown, load 12' is the solenoid, or coil of a relay. Upon interruption of current flow through an inductive load, a turn-off current will occur. To conduct a turn-off current, a free wheeling pnp transistor 22, serially connected with a resistor 23 is connected in parallel to the switching path of the main switching transistor 11. The base of free wheeling or anti-inductive kick transistor 22 is controlled by a Zener diode. The Zener diode is not strictly necessary, for it could be replaced by other suitable circuit elements, such as ordinary diodes, resistors, or the like. The base of transistor 22, in effect, is connected to the emitter of the auxiliary transistor 15.

Operation

If transistor 11 is controlled to cutoff, the emitter voltage of transistor 22 will rise in positive direction. At instant of time when it has risen to such an extent that current will flow through the base-emitter junction of transistor 22, transistor 22 will become conductive and the disconnecting current from the inductive load 12' can be connected through the main switching path, that is, the emitter-collector path of transistor 22 and resistor 23. The Zener diode 24, if used, compensates for voltage drop across resistor 14. It is preferably provided, and insures that transistor 22 will be conductive only at the instant when the voltage at its emitter has at least the voltage of the supply terminal 13.

The collector of transistor 22 could, theoretically, be connected through resistor 23 not to reference or chassis or ground, but also to the base of transistor 11. In this case, the turn-off current would not flow through the transistor 22 but transistor 22 would cause transistor 11 to become conductive and the turn-off current would flow through transistor 11. This permits smaller dimensioning of transistor 22; one of the main current path terminals of transistor 22 are then connected to the junction between the load and transistor 11, and the other terminal is connected to one of the remaining terminals of transistor 11.

Figure 3:
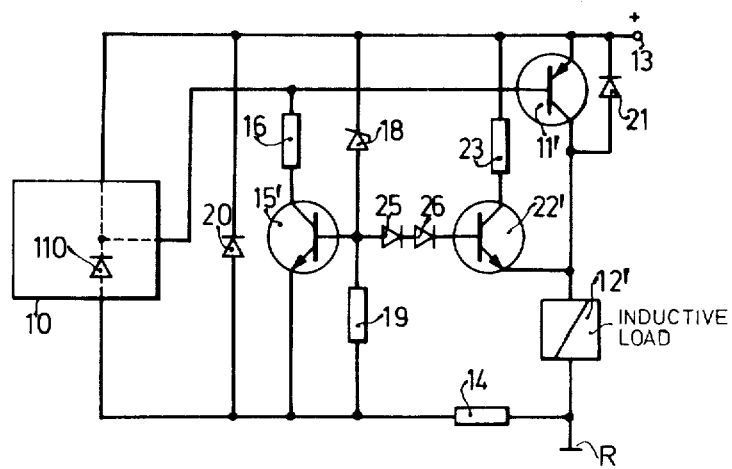
FIG. 3 is a circuit diagram illustrating another embodiment and forming a variation of the circuit of FIG. 2.

Embodiment of FIG. 3: this circuit shows a connection in which an inductive load has one terminal connected to ground or reference, and the control switch therefore is in the positive supply line. A main switching transistor 11' is a pnp transistor, and the free wheeling transistor 15', as well as the bypass transistor 22' are of reverse conductivity type with respect to those previously described, and are npn transistors. The connection of Zener diode 18 and resistor 19 is inverted. The substrate diode 111 does not occur, or, rather, it is identical with the diode 110. Resistor 14 is connected to ground or reference potential. The base of the transistor 22' is connected to the base of the transistor 25 through two serially connected diodes 25, 26.

The control terminal for the turn-off current of the inductive load, that is, the base of transistor 22' is directly connected to the voltage limiting circuit formed by Zener diode 18 and resistor 19, and connected to auxiliary transistor 15'.

The connection of the control terminal of the transistor 22' to the base of transistor 15' or, rather, to the voltage limiting circuit has the advantage that the resistors 19 can have a dual function. It functions, as before, as the emitter resistor for transistor 15; additionally, it functions as a compensating resistor for the voltage drop across resistor 14 when the transistor 22' has become conductive and conducts inductive turn-off current. The two diodes 25, 26 also are compensating diodes; use of one, particularly of more diodes in series results in overcompensation for the voltage drop across resistor 14.

It is not a necessary feature that the voltage limiting circuit 18 is connected directly to the supply voltage; it could also be connected to separate loads, or other circuit elements in order to limit voltages occurring thereafter. The control of transistors 15 and 11, or 15', 11', respectively, will then be effected by overvoltages occurring at the respective loads.

Various changes and modifications may be made and features described in connection with any one of the embodiments may be used with any of the others, within the scope of the inventive concept.

I claim:

1. Overvoltage protective integrated circuit network having
a pair of supply terminals (13, R);
a main controlled semiconductor switch (11) adapted for serial connection with a load (12, 12') and a supply terminal;
and a voltage limiting circuit integrated into the integrated circuit and comprising, in accordance with the invention
an auxiliary transistor (15) having its switching path (emitter-collector) connected to the control terminal of the main controlled semiconductor switch (11);
and voltage sensitive means (18) sensing an overvoltage condition at said supply terminals connected to and controlling the auxiliary transistor to conduction in case of overvoltage to thereby control the main controlled semiconductor switch (11, 11') likewise to a conductive state and prevent excessive current flow through said voltage sensitive means (18) under overvoltage condition.

2. Network according to claim 1 wherein the main controlled semiconductor switch is a switching transistor (11).

3. Network according to claim 1 further including a resistor (16) connected in series with a main switching path (emitter-collector) of the auxiliary transistor (15).

4. Network according to claim 1 further comprising a protective diode (17) connected in parallel to the base-emitter junction of the auxiliary transistor (15).

5. Network according to claim 1 further including a resistor (19) connected in parallel to the base-emitter path of the auxiliary transistor (15).

6. Network according to claim 1 wherein the load includes an inductive load which, upon interruption of supply current thereto, causes an inductive voltage kick and a consequent turn-off current;

and said main controlled semiconductor switch (11) has at least three terminals, two terminals forming the main switching path, and a further terminal forming the control terminal;

further comprising an inductive current bypass transistor (22), having its main switching path (emitter-collector) connected to two terminals of the main controlled semiconductor switch (11), the base of said bypass transistor being connected to a supply terminal.

7. Network according to claim 6 further comprising a current limiting resistor 14 connected between the main supply terminal and the base of the bypass transistor (22, 22').

8. Network according to claim 1 wherein the load includes an inductive load (12') which, upon interruption of supply current thereto, causes and inductive voltage kick and consequent turn-off current;

and said main controlled semiconductor switch 11 has at least three terminals, two forming the main switching path and a further terminal forming the control terminal;

further comprising an inductive current bypass transistor (22, 22') having its main switching path (emitter-collector) connected to two terminals of the main controlled semiconductor switch (11);

the base of said bypass transistor (22, 22') being connected to a terminal at which voltage is either absent or present at a predetermined limited level.

9. Network according to claim 8 wherein the base of said current bypass transistor (22, 22') is connected to a Zener diode (24; 18).

10. Network according to claim 9 further comprising at least one diode (24, 25, 26) connected to the base of the bypass transistor (22, 22').

11. Network according to claim 8 further comprising an element 14 providing resistance value connected to the base of the bypass transistor (22, 22').

12. Network according to claim 8 further including a current limiting resistor (14) connected between one terminal of the supply (13, R) and an input terminal to the integrated circuit;

at least one diode (25, 26) connecting the bases of the auxiliary transistor (15) and the base of the current bypass transistor (22);

and a resistor (19) connected in parallel to the base-emitter junction of said auxiliary controlled semiconductor transistor switch (15), the resistor (19) and diode (25, 26) combination balancing the voltage drop through said current limiting resistor (14) upon flow of inductive turn-off current due to interruption of current from the source through the inductive load upon blocking of the main semiconductor controlled switch.

13. Network according to claim 1 further comprising a polarity protective diode (21) connected in parallel to the main switching path of the main semiconductor controlled switch (11, 11').

14. Network according to claim 1 further comprising a reverse polarity protective diode (20) connected across the supply terminals (13, R) and in parallel to the components of the integrated circuit.

* * * * *